United States Patent [19]

Ito

[11] Patent Number: 5,089,289
[45] Date of Patent: Feb. 18, 1992

[54] METHOD OF FORMING THIN FILMS

[75] Inventor: Naoki Ito, Yokosuka, Japan

[73] Assignee: Fuji Electric Co., Ltd., Japan

[21] Appl. No.: 311,094

[22] Filed: Feb. 15, 1989

Related U.S. Application Data

[63] Continuation of Ser. No. 21,259, Mar. 3, 1987, abandoned.

[30] Foreign Application Priority Data

Mar. 5, 1986 [JP] Japan .................................. 61-47525

[51] Int. Cl.⁵ ...................... C23C 16/50; C23C 16/24; C23C 14/32
[52] U.S. Cl. .................................. 427/38; 204/192.31
[58] Field of Search .................. 427/38; 204/192.31

[56] References Cited

U.S. PATENT DOCUMENTS

| | | | |
|---|---|---|---|
| 4,082,636 | 4/1978 | Takagi | 118/723 |
| 4,227,961 | 10/1980 | Takagi | 427/38 |
| 4,451,547 | 5/1984 | Hirai et al. | 430/128 |
| 4,509,451 | 4/1985 | Collins et al. | 118/50.1 |
| 4,522,674 | 6/1985 | Ninomiya et al. | 427/38 |
| 4,529,475 | 7/1985 | Okano et al. | 427/38 |
| 4,544,423 | 10/1985 | Tsuge et al. | 427/86 |
| 4,624,859 | 11/1986 | Akira et al. | 427/38 |
| 4,636,401 | 1/1987 | Yamazaki et al. | 427/53.1 |

FOREIGN PATENT DOCUMENTS

| | | | |
|---|---|---|---|
| 2601066 | 7/1976 | Fed. Rep. of Germany | 204/192.31 |
| 0125369 | 7/1985 | Japan | 427/38 |

OTHER PUBLICATIONS

Mattox, From Deposition Technolgies for Film and Coatings (Bunshah, first listed author), (Noyes Publications, Park Ridge, N.J.) c. 1982, pp. 245–268.

Primary Examiner—Shrive Beck
Attorney, Agent, or Firm—Brumbaugh, Graves, Donohue & Raymond

[57] ABSTRACT

Thin films having controlled properties are formed on a substrate by a method comprising the steps of (a) placing the substrate on a support member within a reaction chamber capable of being evacuated;

(b) introducing a flow of material gas into the reaction chamber through a gas inlet port such that the material gas flows toward the substrate;

(c) accelerating charged particles from a charged particle beam source to a predetermined energy level;

(d) introducing the accelerated charged particles as a beam into the reaction chamber such that the beam intersects with the flow of material gas in the vincinity of the gas inlet port whereby substantially all of the material collides with charged particles in the beam to form at least one reactive species from the material gas; and (e) allowing the reactive species to flow to and strike the substrate whereby a thin film is formed on the substrate. The nature of the material gas and the energy level of accelerated charged particles are varied to contol the type of reactive species produced.

7 Claims, 3 Drawing Sheets

METHOD OF FORMING THIN FILMS

This application is a continuation of application Ser. No. 021,259, filed on Mar. 3, 1987 now abandoned.

BACKGROUND OF THE INVENTION

This invention relates to the formation of thin films by chemical vapor deposition (CVD) using a beam of charged particles as a source of energy to decompose a material gas into reactive species that are deposited on a substrate, thereby forming a film thereon.

Methods of forming thin films by CVD are known in which a material gas is supplied to a reaction chamber and decomposed to generate radicals that are deposited on a substrate. The most common of these known methods is plasma CVD, in which a low-ionized plasma is formed in a glow discharge. As illustrated in FIG. 1, in this known method material gas is introduced through an inlet pipe 5 into a reaction chamber 1 which has been evacuated to a pressure of several hundred millitorr via evacuation port 16. When an alternating current is applied to a high frequency electrode 17 by a high frequency power source 18, a glow discharge results which ionizes the material gas to generate a plasma. This plasma excites the material gas which then decomposes and generates radicals. The radicals are deposited on the surface of a substrate 3 which is maintained at a predetermined temperature by means of a heater 4.

However, when using CVD methods which make use of plasma as the energy source it is difficult to control the properties of the film. This difficulty arises because electrons in the plasma have a wide energy distribution. Thus, various types of radicals are generated and, therefore, the reaction(s) become varied.

Recently, another conventional method which makes use of ultraviolet light in place of plasma as the source of energy has drawn attention. This so-called photo CVD method is illustrated in FIG. 2. In the photo CVD method, material gas is introduced into a reaction chamber 1, which has been evacuated, through a material gas inlet tube 5, and ultraviolet rays 19 from a light source 20 are radiated into the material gas through an entrance window 21. At this time, the material gas is decomposed by the ultraviolet rays 19 and generates radicals. In such a photo CVD method, it is possible to select a particular wavelength of the rays from the light source. These selected photons have a particular energy level and act to generate specific radicals so that only specific reaction(s) will be promoted. Further, in a photo CVD method, it is possible to condense rays at an arbitrarily selected spot by using optical lenses or reflecting mirrors so as to improve reaction efficiency.

However, the photo CVD method has the defect that radicals generated as a result of the optical decomposition attach to and fog the ray entrance window 21, thus impeding the advancement of the reaction(s). In addition, since the light sources which have been used to date are able to provide energy of at most about 7 eV per photon, it has been impossible to use photons having an arbitrarily selected level of energy.

An object of the present invention is to overcome the above defects of the prior art, and to provide a method of forming a thin film which can ensure improved controllability over the properties of the thin film to be formed by decomposition reaction(s) of material gas.

SUMMARY OF THE INVENTION

The above object of the invention is achieved by a method of forming a thin film comprising the steps of: placing a substrate on which the thin film is to be formed on a substrate support member disposed in a reaction chamber capable of being evacuated; introducing material gas for forming the thin film into the reaction chamber in such a direction that the material gas flows toward the substrate; accelerating charged particles from a charged particle beam source to a predetermined energy level capable of exciting the material gas thus supplied into said reaction chamber, and introducing the accelerated charged particles as a beam into the reaction chamber such that the beam intersects with the flow of the material gas in the vicinity of the gas inlet port whereby substantially all of the material gas introduced to the reaction chamber collides with charged particles in the beam. When accelerated charged particles from the charged particle beam source collide with the material gas, the material gas is excited by the charged particles and converted into various reactive species, including both ions and radicals. The reactive species are then allowed to flow to and strike the substrate whereby a thin film forms on the substrate.

According to the method of the invention, because the energy of charged particles is increased acceleration to a predetermined value, material gas excited by the charged particle decomposes into desired radicals, thereby providing an opportunity to select the reaction(s) leading to film formation. Further, because the charged particle beam intersects, at a predetermined angle, the material gas flow in the vicinity of the gas inlet port, before there has been significant expansion of the flow within the reaction chamber, substantially all the material gas is able to collide with the charged particles and is thereby ionized, excited, and decomposed. Moreover, because the gas inlet port of the gas supplying means is directed in such a manner that the material gas flows toward the substrate, radicals generated by the excitement and decomposition are sprayed onto the substrate and are thereby deposited on the surface of the substrate effectively.

DETAILED DESCRIPTION OF THE INVENTION

Figure 1:
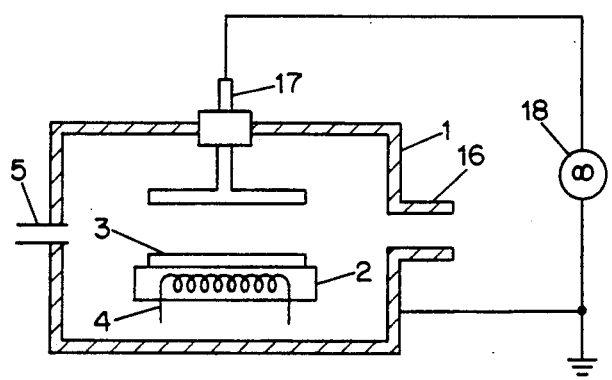
FIG. 1 is a view showing the principle of a conventional low-ionized plasma CVD method.
Figure 2:
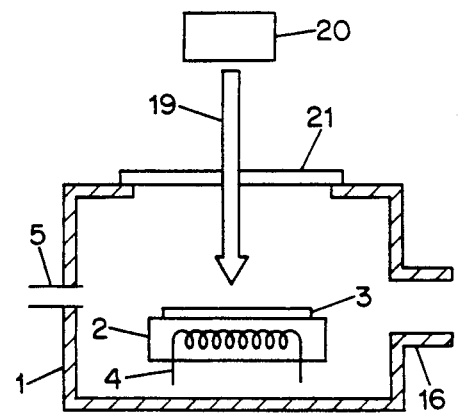
FIG. 2 is a view showing the principle of a conventional photo CVD method.
Figure 3:
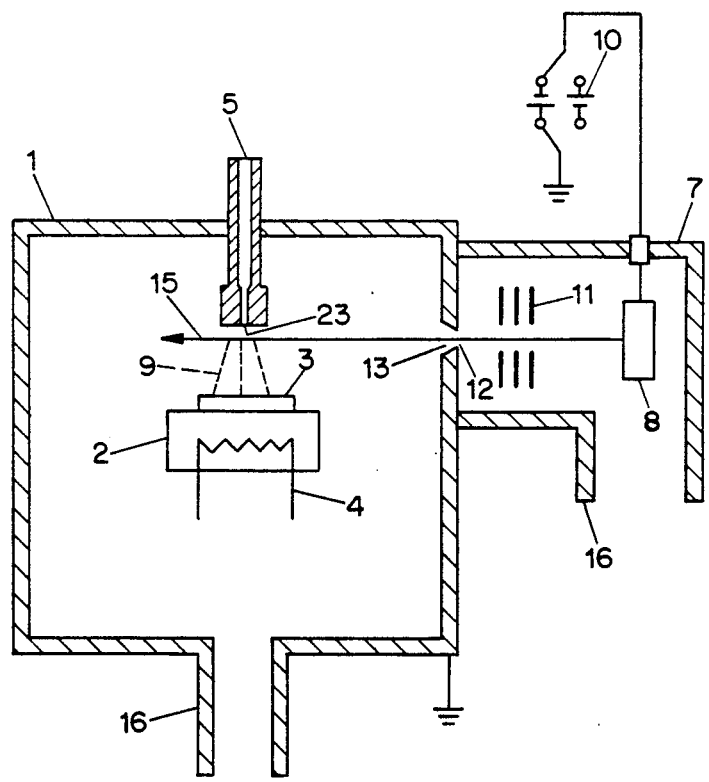
FIG. 3 is a sectional view through a first embodiment of the invention.

A first embodiment of the invention will now be described with reference to FIG. 3. In FIG. 3, elements and component parts corresponding to those shown in FIGS. 1 and 2 are designated by the same reference numbers.

A substrate supporting member 2 is disposed in a reaction chamber 1, and a substrate 3 is mounted on the supporting member 2. The temperature of the substrate 3 is set at a predetermined value by means of a heater 4. A nozzle 6 through which material gas is introduced to the reaction chamber 1 is connected to a material gas inlet pipe 5, and the gas inlet port of the nozzle 6 is directed in such a manner that a flow of reaction gas will be directed toward the substrate. The interior of the reaction chamber 1 and a beam chamber 7 connected thereto is evacuated to a high degree of vacuum of, e.g., $10^{-4}$ torr or below, through a vacuum evacuation speed.

Either an ion beam or an electron beam may be used as the beam 15 of charged particles. A charged particle beam source 8 may be either an ion source or an electron source. Suitable ion source for use in the invention include those types which employ radio frequency discharge, microwave discharge, duoplasmatron, and electron impact; while suitable electron sources include those types which employ thermion and holocathode.

Charged particles generated by the charged particle beam source 8 can be accelerated in the direction of the nozzle 6 by means of a beam accelerating power source 10. A suitable acceleration method comprises, for instance, making the potential of the charged particle beam source 8 positive relative to that of both the reaction chamber 1 and the nozzle 6 when the beam is a positive ion beam, or making the potential of the source 8 negative relative to the same when the beam is an electron beam. A suitable potential value within a range from several volts to several kilovolts is selected as the potential for the acceleration. The charged particle beam 15 is caused to converge in the vicinity of a gas inlet port 23 at the tip of the nozzle 6 by means of a group of electrostatic lenses 11 disposed within the beam chamber 7. A hole 12 through which the beam is introduced to the chamber 1 is formed by an orifice 13 which acts to converge the charged particle beam 15 and also to reduce the diffusion of the material gas.

When forming a thin film made of, for example, amorphous silicon, the material gases which may be used are gases of the silane series (such as $SiH_4$ and $Si_2H_6$), or mixtures thereof with gases for dilution (such as inert gases, i.e. argon, and $H_2$). Germane series gases and other material gases might also be used in place of, or in combination with the silane gas. The material gas is discharged from the nozzle 6 and advances toward the substrate 3 in the form of a freely expanding flow. A material gas flow 9 formed immediately after having been discharged from the nozzle 6 is intersected by the charged particle beam 15 at a predetermined incident angle. Because the beam 15 intersects the material gas flow before a significant amount of expansion has occurred, substantially all the material gas collides with the charged particle beam 15. Some of the material gas which thus collides with the beam is ionized, while other parts of it are excited, or decomposed, thereby generating a large number of radicals. Because the material gas inlet port is directed in such a manner that the material gas flow will be directed toward the substrate, the radicals generated by the reaction(s) between the flow of material gas and the charged particle beam form the material gas flow 9 and are sprayed onto the substrate 3 and deposited on the surface of the substrate. This arrangement, together with the above-described effect of intersection, enables efficient formation of a thin film.

The energy of the charged particles can be controlled at a predetermined value by selecting the value of the potential for acceleration. The cross-sectional area of the reaction(s) which would be indicative of the probability of decomposition of the material gas varies in accordance with the energy of the charged particles and has a peak value, while a peak energy value of the charged particles corresponding to this peak value is characteristic of each decomposition reaction. Therefore, by varying the potential for acceleration and by thus controlling the energy of the charged particles at a predetermined value, it is possible to cause arbitrarily selected decomposition reaction(s). In this control, the value of the energy of the charged particles is selected in accordance with the peak value of a target cross-sectional area of the reaction(s) indicating the desired decomposition reaction(s).

The charged particle beam is advantageously formed in a separate beam chamber, and introduced to the reaction chamber via a beam emission hole 12. By reducing the diameter of the orifice 13 found at the beam emission hole 12, the orifice can act to reduce the amount of diffusion of the material gas into the beam chamber, thereby protecting the beam source 8 and also preventing scattering of the beam 15.

The supply of the material gas by means of the nozzle 6 may be effected either continuously or intermittently. The reason for such an intermittent operation is the need to maintain the degree of vacuum within the reaction chamber at a predetermined value. When an intermittent supply of the material gas is effected, the thin film is formed on the surface of the substrate 3 at a variable rate which oscillates between high deposition rates and low deposition rate as the flow of material gas changes. When effecting an intermittent supply of the material gas, radiation of the charged particle beam 15 may be effected in synchronism with the supply of the material gas, or in lagged synchronism, or in a continuous manner.

The charged particle beam 15 is made to intersect the flow 9 of the material gas at a predetermined incident angle. Although an incident angle of 90 degrees is normally adopted, this is not limitative.

Advantageously, the potential of the substrate support member 2 may be biased toward the positive or negative when the generated ions are positive or negative, respectively. As a result, the ions do not strike the substrate 3 and only radicals are deposited on the substrate 3 by the action of the electric field. This eliminates deterioration of film quality caused by the collision of ions with the film. In addition, the substrate 3 can be moved with a scanning motion relative to the nozzle 6 to aid in the formation of a uniform thin film, particularly on a large substrate.

Figure 4:
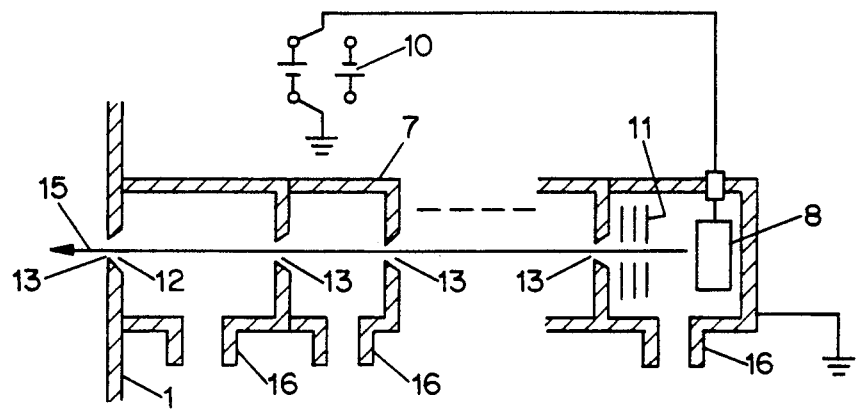
FIG. 4 is a fragmentary sectional view through a second embodiment of the invention.

FIG. 4 shows a second embodiment of the invention. In this embodiment, a series of orifices 13 which serve beam source 8 and the beam emission hole 12 and each of the orifices 13 through which the beam 15 passes is formed in the partition wall between two adjacent ones of the small chambers each of which can be evacuated through the corresponding evacuation port 16. By virtue of this method, the beam source 8 can be protected, and scattering of the beam 15 can be further effectively prevented.

Figure 5:
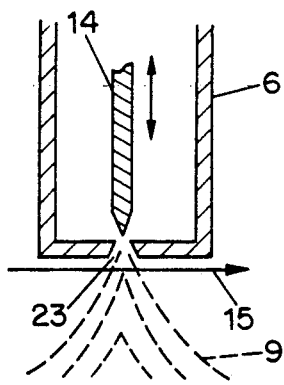
FIGS. 5 and 6 are fragmentary sectional views through a third embodiment of the invention.
Figure 6:
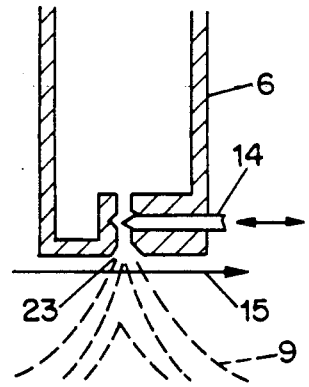

FIGS. 4 and 5 show a third embodiment of the invention. In this embodiment, the nozzle additionally includes a valve such as a need valve. In this case, the material gas is supplied from the gas inlet port 23 to the reaction chamber 1 by opening and closing the needle value 14, thereby enabling an effective supply of the material gas in an intermittent manner. The opening and closing of the needle valve 14 may be realized, for example, by adopting a mechanical operation (using a spring, high-pressure gas, or the like), or an electrical operation (using an electromagnet or the like), or a combination thereof.

The following results were obtained from experiments with this embodiment. The experiments were conducted using an electron beam having an energy of 10 eV or 20 eV to excite silane gas ($SiH^4$) under the following conditions:

a gas pressure within the nozzle of 1.5 kg/cm$^2$.

a nozzle opening-closing frequency of 1 Hz;

an internal pressure within the reaction chamber of about 0.1 torr; and a substrate temperature of 250° C. In the experiments, thin films of amorphous silicon were formed, and the film properties were as follows:

| PROPERTIES OF THIN FILMS OBTAINED BY ELECTRON BEAMS | | | |
| --- | --- | --- | --- |
| ELECTRON BEAM ENERGY (eV) | PHOTO-CONDUC-TIVITY (S · cm$^{-1}$) | DARK CONDUC-TIVITY (S · cm$^{-1}$) | CONDITION OF CRYSTAL |
| 10 | $1 \times 10^{-4}$ | $2 \times 10^{-9}$ | AMORPHOUS |
| 20 | $1 \times 20^{-6}$ | $5 \times 10^{-7}$ | MICRO CRYSTALS |

When the electron beam energy was 10 eV, the obtained film quality was amorphous, while when it was 20 eV the film had micro crystals. The photoconductivity and dark conductivity obtained when the electron beam energy was 10 eV were substantially the same as those measured for samples prepared in accordance with prior art CVD methods. Those of materials prepared using a 20 eV beam energy were substantially different. In this way, it can be understood that the properties of the thin film can be controlled by selecting the value of the electron beam energy.

Figure 7:
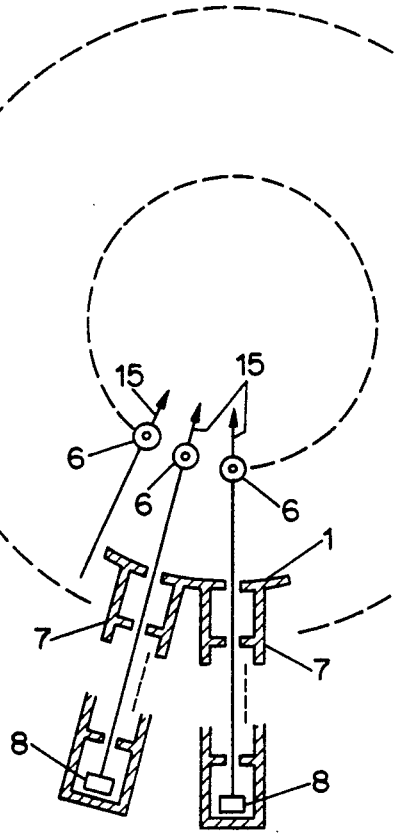
FIGS. 7 and 8 are sectional views showing the arrangement of nozzles and beam chambers in accordance with a fourth embodiment of the invention.
Figure 8:
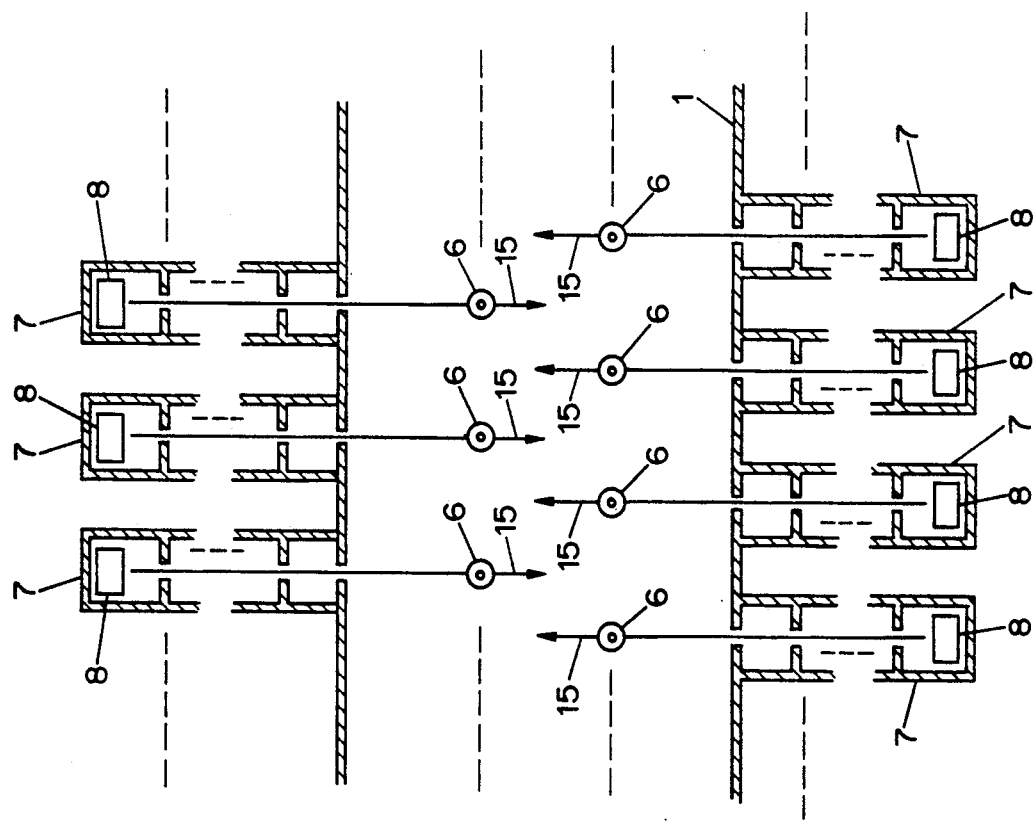

A fourth embodiment of the invention is shown in FIGS. 7 and 8. In this embodiment, a plurality of nozzles 6 are disposed in the reaction chamber 1 for introducing the material gas. The arrangement may be in the form of a circle (as shown in FIG. 7), an oval, a straight line (FIG. 8), or a lattice. A plurality of beam chambers 7 of the same number as the nozzles 6 are provided in such a manner that each of the beams will correspond to one of the nozzles. With such an arrangement, when the same material gas is supplied to the nozzles, a thin film of a large area can be formed, while when different material gases are supplied to the nozzles, a thin film of an alloy of these gases can be formed.

Figure 9:
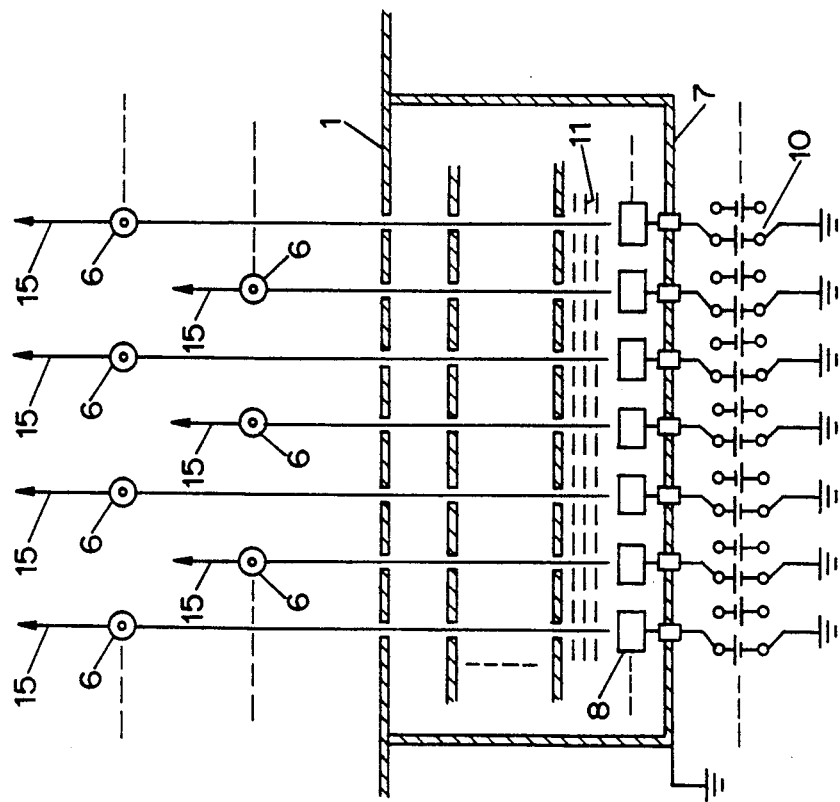
FIG. 9 is a fragmentary sectional view through a fifth embodiment of the invention.

A fifth embodiment of the invention is shown in FIG. 9. In this embodiment, in one beam chamber 7, a plurality of beam sources 8 and a corresponding number of groups of electrostatic lenses 11 are provided. When this arrangement is adopted, the beam chamber 7 can be small, thus making the entire apparatus compact.

According to the present invention, it is possible to select and determine the acceleration energy of charged particles which are used for the decomposition of a material gas in accordance with the peak value of the cross-sectional area of the desired reaction(s), and thus cause selective generation of the desired radicals by the decomposition of the reaction gas with reduced generation of radicals other than those desired. As a result, it is possible to form a thin film having the particular properties desired. In addition, the method of the invention is adapted to radiate a beam of the charged particles in such a manner that is converges with the material gas flow at a portion thereof which is ahead of the free expansion within the reaction chamber and in the vicinity of the gas inlet port, so that both the concentration of the material gas and the flux of the charged particles will be high, thereby enabling generation of a large amount of the desired radicals. Since the inlet port of the material gas supplying means is disposed so as to face the substrate, the radicals thus generated will be sprayed onto the substrate and deposited on the surface of the substrate, thereby enabling an efficient formation of a target thin film.

I claim:

1. A method of forming, a material consisting essentially of a substrate and a thin film disposed on a major surface thereof by enhanced chemical vapor deposition consisting essentially of the steps of
   (a) placing the substrate on a support member within a reaction chamber capable of being evacuated;
   (b) introducing a flow of material gas into the reaction chamber such that the material gas flows toward the substrate;
   (c) accelerating charged particles from a charged particle source selected from the group consisting of an ion beam and an electron beam to a predetermined energy level;
   (d) introducing the accelerated charged particles as a beam into the reaction chamber such that the beam intersects with the flow of material gas in the vicinity of the gas inlet port whereby substantially all of the material gas collides with charged particles in the beam and is decomposed to form charged and uncharged reactive species from the material gas;
   (e) applying a potential to the support member such that charged species formed by the collision of the beam and the material gas are repelled from the substrate; and
   (f) allowing the uncharged reactive species to flow to and strike the substrate whereby the thin film is formed on the substrate, wherein the nature of the material gas and the energy level of the accelerated charged particles are varied to control the type of reactive species produced.

2. A method according to claim 1, further comprising the step of applying a potential to the support member such that charged species formed by collision of the beam and the material gas are repelled from the substrate.

3. A method according to claim 1, wherein the thin film is amorphous silicon and the material gas comprise a gas of the silane series.

4. A method according to claim 3, wherein the material gas comprises a gas of the silane series and a diluent gas selected from the group consisting of the inert gases and hydrogen.

5. A method according to claim 1, wherein the flow of material gas is introduced to the reaction chamber intermittently.

6. A method according to claim 5, wherein the flow of material gas is regulated by a needle valve.

7. A method according to claim 5, wherein the accelerated charged particles are introduced to the reaction chamber intermittently in synchronism with the flow of material gas.

* * * * *